United States Patent
Pate et al.

(10) Patent No.: US 6,754,605 B1
(45) Date of Patent: Jun. 22, 2004

(54) METHOD AND SYSTEM FOR AUTOMATING DATA STORAGE ARRAY COMPONENTS TESTING WITH INTEGRATED WORK ORDER DISPATCHING

(75) Inventors: James D. Pate, Derby, KS (US); Justin B. Mortensen, Wichita, KS (US); Steven G. Hagerott, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/414,126

(22) Filed: Apr. 15, 2003

(51) Int. Cl.[7] .............................................. G01R 31/00
(52) U.S. Cl. ...................... 702/115; 702/118; 702/182; 714/42
(58) Field of Search .................................. 702/117, 118, 702/119, 108, 113, 115, 182, 183; 714/10, 20, 25, 30, 42; 711/111–113; 709/201, 203, 220, 240

(56) References Cited

U.S. PATENT DOCUMENTS 4,419,747 A * 12/1983 Jordan ........................ 365/201
5,457,696 A * 10/1995 Mori ........................... 714/720
5,966,510 A * 10/1999 Carbonneau et al. .......... 714/44
2002/0170969 A1 * 11/2002 Bridgelall .............. 235/462.13

* cited by examiner

Primary Examiner—Bryan Bui
(74) Attorney, Agent, or Firm—Suiter West PC LLO

(57) ABSTRACT

The present invention is directed to a method and system for automating data storage array components testing. A serial number of a data storage array component (i.e., product) is used to determine if the product is of high priority (rank) in comparison with other products in a queue and there is any test cell available for testing the product. Next, if a test is required, the product type and test requirements of the product are retrieved from a database based on the serial number, and the product is routed to the test cell from an assembly line. Then the product and a storage component interface module of the test cell are positioned so that the product and the storage component interface module face each other. The storage component interface module is chosen based on the test requirements retrieved from the database. Next the product is docked into the storage component interface so that the product is connected to the storage component interface module. Then the test is run to completion. The product is then routed down the assembly line to packaging and the customer.

57 Claims, 5 Drawing Sheets

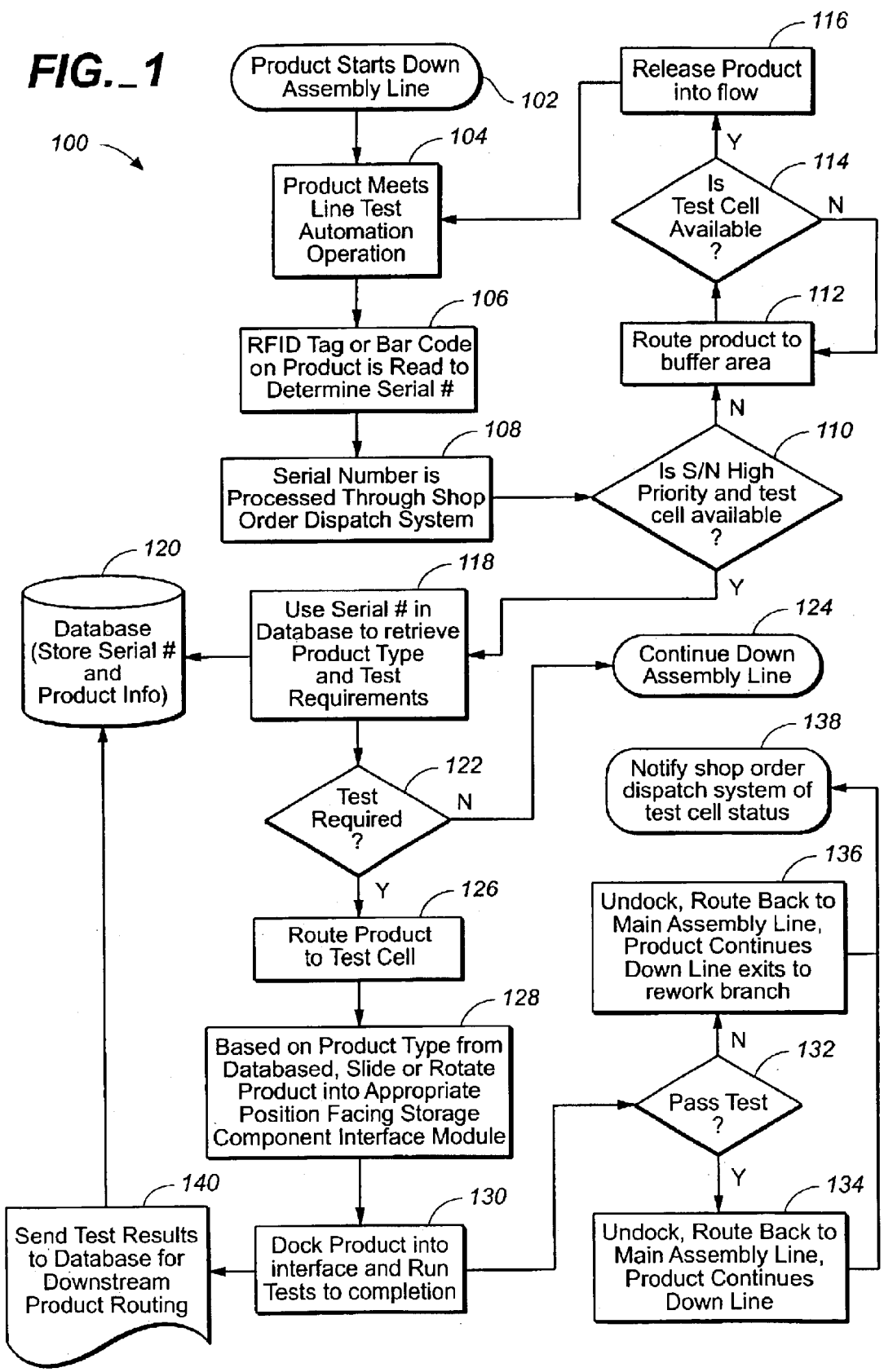
FIG._1

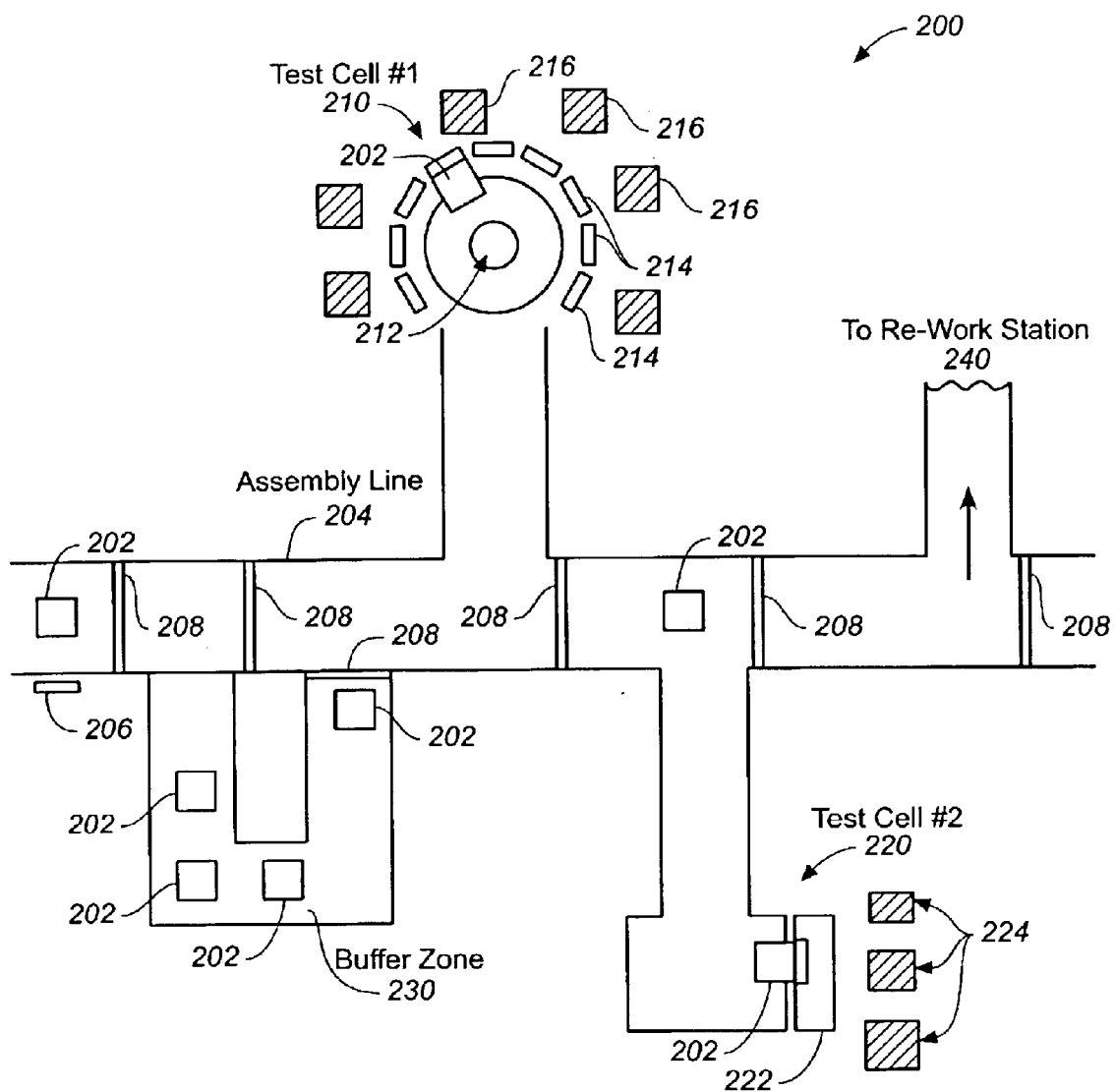
FIG._2

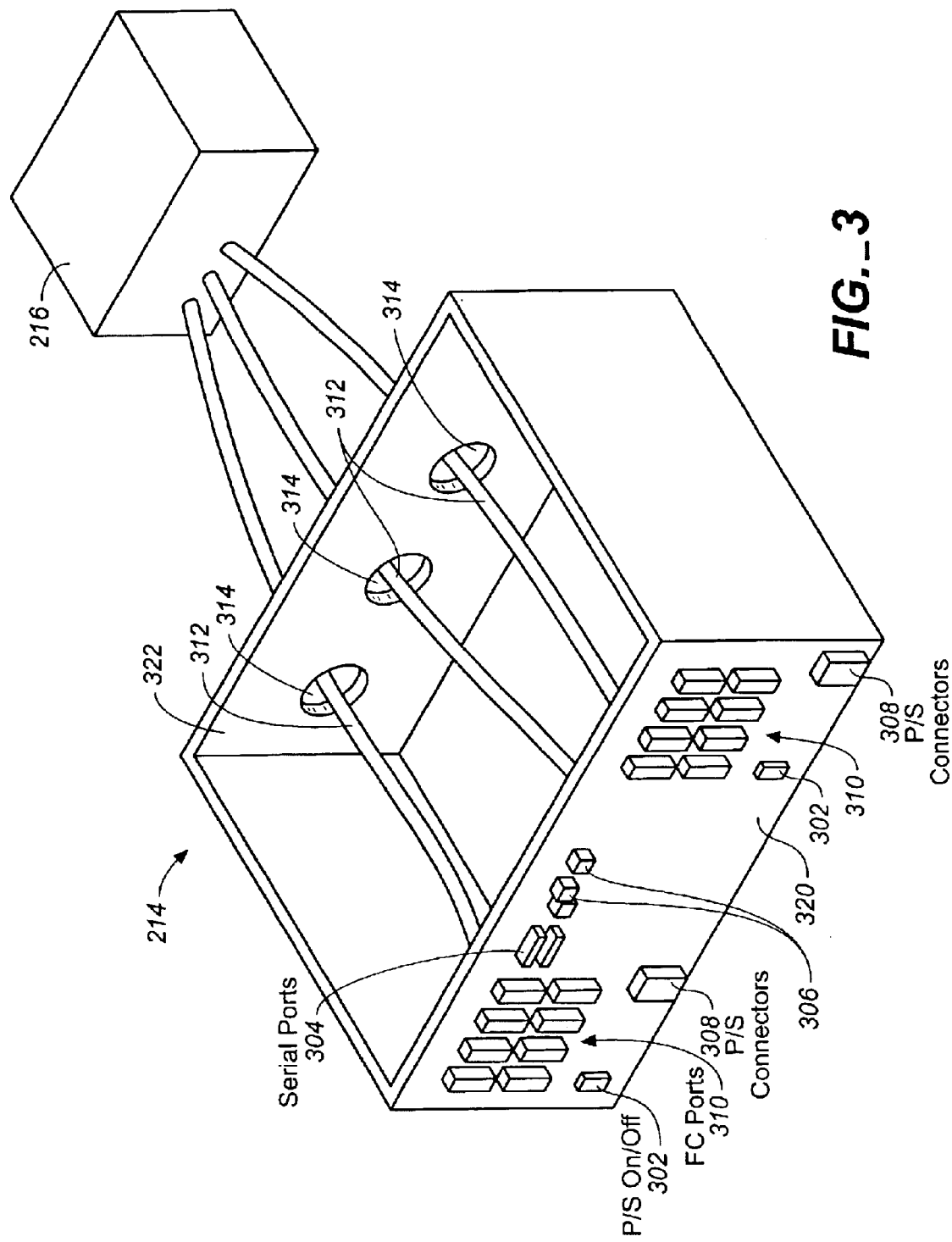

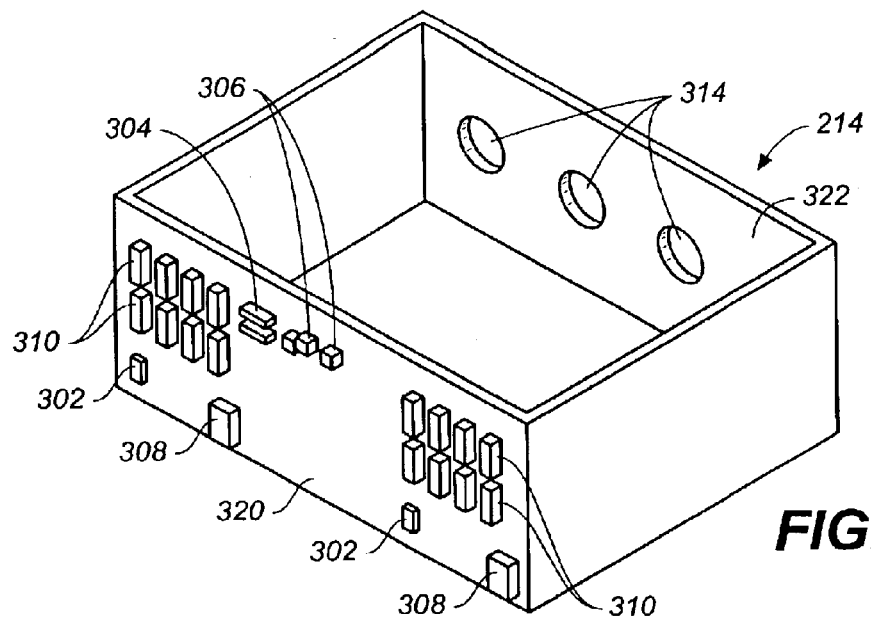
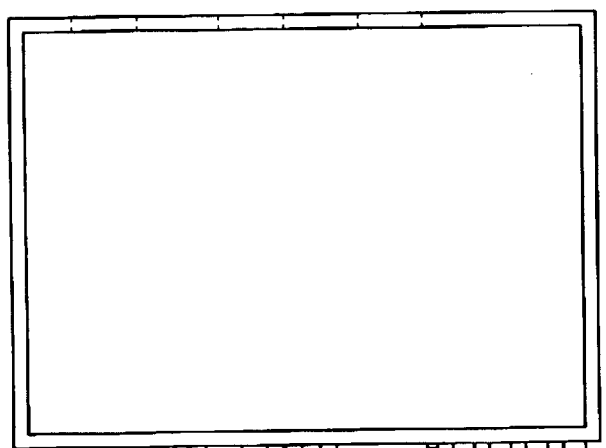
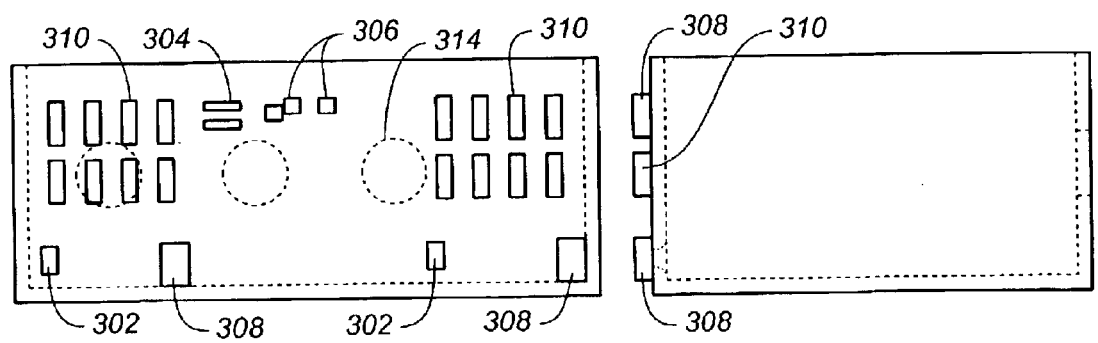
FIG._4
FIG._4A
FIG._4B
FIG._4C

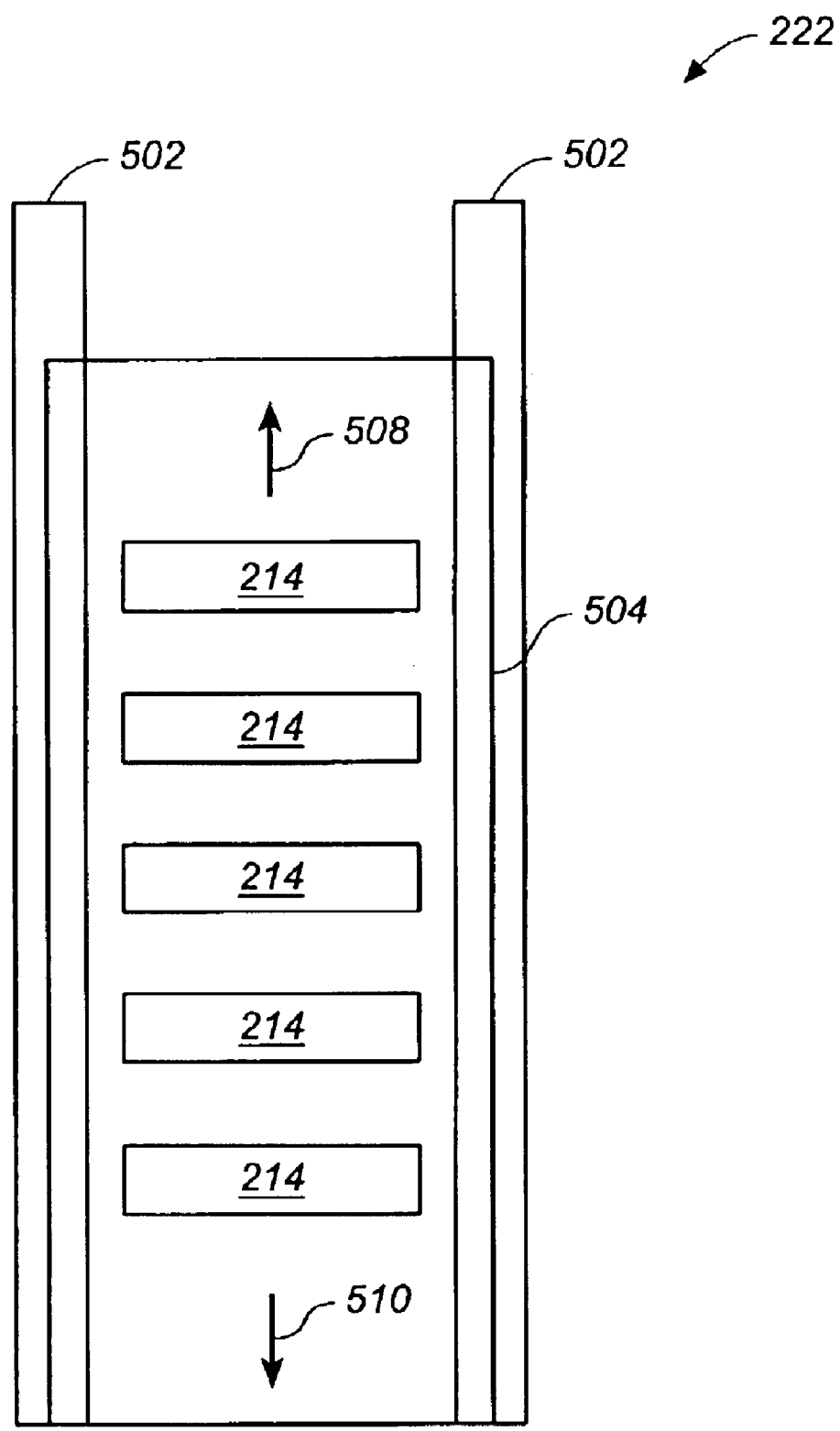
FIG._5

US 6,754,605 B1

METHOD AND SYSTEM FOR AUTOMATING DATA STORAGE ARRAY COMPONENTS TESTING WITH INTEGRATED WORK ORDER DISPATCHING

FIELD OF THE INVENTION

This invention relates generally to testing of data storage devices, and particularly to a method and system for automating data storage array components testing with integrated work order dispatching.

BACKGROUND OF THE INVENTION

Testing of data storage array components (i.e., data storage modules such as controllers, drive trays, and the like) is often a labor intensive, time consuming, and expensive process. A lot of human involvement may be required to dispatch and prioritize the data storage array components, and position and connect the data storage array components to a storage array network (SAN) for testing. Moreover, time consuming and expensive work force training may be needed for testing of a new data storage array component.

Thus, it would be desirable to have a method and system for automating data storage array components testing, which may reduce human involvement and may reduce cost and time required for testing.

SUMMARY OF THE INVENTION

Accordingly, the present invention is directed to a method and system for automating data storage array components testing with integrated work order dispatching.

According to a first aspect of the present invention, a method for automating data storage array components testing includes the following steps. First, a serial number of a data storage array component is obtained. Then the serial number is processed through a shop order dispatch system to determine if the serial number is of high priority in comparison with other products in a queue and there is any test cell available for testing the data storage array component. Next, when the serial number is of high priority and when there is a test cell available, the product type and test requirements of the data storage array component are retrieved from a database based on the serial number, e.g., via a manufacturing execution system (MES). If a test is required for the data storage array component, the data storage array component is routed to the test cell from an assembly line. Then the data storage array component and a storage component interface module of a storage component interface of the test cell are positioned so that the data storage array component and the storage component interface module face each other. The storage component interface module is chosen based on the test requirements retrieved from the database. Next the data storage array component is docked into the storage component interface so that the data storage array component is connected to the storage component interface module. Then the test is run to completion.

According to a further aspect of the present invention, a system for automating data storage array components testing includes an assembly line, a RFID (Radio Frequency Identification) scanner or a bar code scanner for reading a serial number of a data storage array component on the assembly line, and a test cell for testing the data storage array component, wherein the test cell is connected to the assembly line.

According to an additional aspect of the present invention, a storage component interface module includes a first surface including at least one of power source, power on/off switches, serial ports, Ethernet connectors, power source connectors, and Fibre Channel ports. Wiring for testing a data storage array component is provided via the storage component interface module.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a flow chart of an exemplary process used for automating data storage array components testing with integrated work order dispatching in accordance with the present invention;

FIG. 2 shows an exemplary system for automating data storage array components testing with integrated work order dispatching, which system includes storage component interfaces comprised of a plurality of storage component interface modules, in accordance with the present invention;

FIG. 3 shows an exemplary embodiment of a storage component interface module shown in FIG. 2 in accordance with the present invention;

FIG. 4 is a plan view of the storage component interface module shown in FIG. 3;

FIG. 4A is a top plan view of the storage component interface module shown in FIG. 4;

FIG. 4B is a front elevation view of the storage component interface module shown in FIG. 4;

FIG. 4C is a side elevation view of the storage component interface module shown in FIG. 4; and FIG. 5 shows an exemplary embodiment of a storage component interface having a ladder/magazine configuration shown in FIG. 2 in accordance with the present invention.

DETAILED DESCRIPTION OF THE INVENTION

Reference will now be made in detail to the presently preferred embodiments of the invention, examples of which are illustrated in the accompanying drawings.

Referring first to FIG. 1, a flow chart of an exemplary process 100 used for automating data storage array components testing with integrated work order dispatching in accordance with the present invention is shown. The process 100 may start with step 102 in which a product such as a data storage array component, or the like starts down an assembly line. A data storage array component may be a data storage module such as a controller, a drive tray, or the like. Next, the product may meet a line test automation operation in step 104. The line test automation operation may occur post-assemble and may be a functional test (pass or fail). In step 106, a RFID tag or a bar code on the product may be read (e.g., by a RFID scanner, by a bar code scanner) to determine a serial number of the product, which may be generated via a manufacturing execution system (MES) or the like. The serial number may then be processed through a shop order dispatch system in step 108. In step 110, the serial number may be checked to see if the serial number is of high priority in comparison with other products in a queue, and test cells may be checked to see if any test cell is available for testing the product. The priority (ranking) of a serial number may be determined by a lot of factors including customer requirements. For example, when a customer urgently needs a product, the serial number of the product may have a high priority.

If the serial number is of low priority or there is no test cell available for testing the product, the product may be routed to a buffer area or zone in step 112. Then whether a test cell is available for testing the product may be checked in step 114. If no test cell is available for testing the product, the process 100 may return to the step 112. If at least one test cell is available for testing the product, the product may be released into work flow (i.e., released to the assembly line) in step 116. Following the step 116, the process 100 may return to the step 104.

Alternatively, if the serial number is of high priority and there is at least one test cell available for testing the product, in step 118 the serial number may be used to retrieve information such as the product type and the test requirements for the product in a database 120, which may store information such as product serial numbers, product types, test requirements, and the like. The inquiry of whether a test is required may be held in step 122. If a test is not required for the product, the product may continue down the assembly line in step 124. If a test is required, in step 126 the product may be routed to an available test cell that is capable of testing the product according to the test requirements retrieved in step 118. Next, based on the product type information obtained from the database 120, in step 128 the product may be placed (e.g., by rotating, sliding, or the like) into a position facing an appropriate storage component interface module of a storage component interface of the test cell. Alternatively, in step 128 an appropriate storage component interface module of a storage component interface of the test cell may be placed (e.g., by rotating, sliding, or the like) into a position facing the product. Then, in step 130 the product may be docked into the storage component interface so that the product is connected to the storage component interface module, and the test may be run to completion.

Following the step 130, the test results of the product may be sent to the database 120 for downstream product routing in step 140. The test results may include information such as whether the product passes the test, what components of the test the product passes, date/time stamp, and the like. Following the step 130, whether the product passes the test may be checked in step 132. If the product passes the test, the product may be undocked and routed back to the assembly line, and the product may continue down the assembly line in step 134. The shop order dispatch system may then be notified of the status of the test cell, i.e., the test cell is now available, in step 138. If the product does not pass the test, the product may be unlocked and routed back to the assembly line, and the product may continue down the assembly line and exit to a re-work branch or station for re-work in step 136. The product may be tagged with a RFID or a bar code as a reject and will not be allowed into standard workflow until re-work is complete and a retest is appropriate. Following the step 136, the process 100 may go to the step 138.

FIG. 2 shows an exemplary system 200 for automating data storage array components testing with integrated work order dispatching in accordance with the present invention. The process 100 may be implemented in the system 200. The system 200 may include an assembly line 204 on which a product 202 such as a data storage array component or the like may be transported and/or assembled, a buffer zone 230 where the product 202 may be kept temporarily a re-work station 240 (not all shown in FIG. 2) where re-work may be performed on the product 202 after the product 202 fails a test, and two types of test cells where testing for the product 202 may be performed: a test cell 210 (Test Cell # 1) having a star configuration, and a test cell 220 (Test Cell # 2) having a ladder/magazine configuration. The test cell 210 may include a storage component interface comprised of a plurality of storage component interface modules 214, a plurality of SAN targets 216 such as PCs, hosts, and the like communicatively coupled to the storage component interface, and a rotating carousel 212 for rotating the product 202 to face an appropriate storage component interface modules 214. The test cell 220 may include a storage component interface 222, which will be described in detail along with FIG. 5 below, and a plurality of SAN targets 226 such as PCs, hosts, and the like communicatively coupled to the storage component interface 222.

As the product 202 continues down the assembly line, a RFID tag (or a bar code) of the product 202 may be read by a RFID scanner (or a bar code scanner) 206 to determine a serial number of the product 202. The serial number may be processed through a shop order dispatch system (not shown in FIG. 1) which may determine whether the serial number is of high priority in comparison with other products in a queue and/or whether there is any test cells available for testing the product 202.

If the serial number is of low priority or there are no test cells available, then the product 202 may be routed to the buffer zone 230. The buffer zone 230 may be used to keep the product 202 temporarily when there is no test cell available for testing the product 202. When there is a test cell available for testing the product 202, the product 202 may be released into work flow (i.e., released to the assembly line 204) from the buffer zone 230, e.g., through a gate 208. It is understood the buffer zone 230 may have any configuration as may be contemplated by a person of ordinary skill in the art without departing from the scope and spirit of the present invention. For example, the buffer zone 230 may include a rotating carousel (not shown) to hold the product 202.

Alternatively, if the serial number is of high priority and there is at least one test cell available, then the serial number may be used to retrieve the product type and the test requirements for the product 202 in a database (not shown in FIG. 1), which may store information such as product serial numbers, product types, test requirements, and the like. If no test is required for the product 202, the product 202 may continue down the assembly line 204. Alternatively, if a test of the product 202 is required, the product 202 may be routed to a test cell: either the test cell 210 or the test cell 220, based on the test requirements retrieved from the database.

When the product 202 is routed to the test cell 210, based on the product type information from the database, the product 202 may be placed on a rotating carousel 212 and put into a position facing an appropriate storage component interface module 214 as required by the test requirements from the database. The storage component interface module 214 will be described in detail below along with FIGS. 3 and 4. The product 202 may then be released from the rotating carousel 212 and docked into the storage component interface so that the product 202 may be connected to the appropriate storage component interface module 214 for testing. Those of ordinary skill in the art will understand that the rotating carousel 212 may hold more than one product at the same time and may distribute the products to corresponding storage component interface modules in turn. After the test is finished, the product 202 may be undocked, returned to the rotating carousel, and routed back to the assembly line 204, and the shop order dispatch system may be notified of the status of the test cell 210. If the product 202 passes the test, the product 202 may continue down the line 204. If the product 202 does not pass the test, the product 202 may exit to the re-work station 240.

Alternatively, when the product 202 is routed to the test cell 220, based on the product type and test requirements information retrieved from the database, an appropriate storage component interface module 214 (not shown in FIG. 2, but see FIG. 5) of the storage component interface 222 may be placed (e.g., by sliding) into a position facing the product 202. The product 202 may be then docked into the interface 222 so that the product 202 is connected to the appropriate storage component interface 214 for testing. After the test is finished, the product 202 may be undocked and routed back to the assembly line 204, and the shop order dispatch system may be notified of the status of the test cell 220. If the product 202 passes the test, the product 202 may continue down the assembly line 204. If the product 202 does not pass the test, the product 202 may exit to the re-work station 240.

It is understood that FIG. 2 is intended as an exemplary system for automating data storage array components testing with integrated work order dispatching in accordance with the present invention and not as an architectural limitation to the present invention. Those of ordinary skill in the art will appreciate that various combinations and arrangements may be employed without departing from the scope and spirit of the present invention. For example, although two types of test cells are shown in FIG. 2, a system according to the present invention may alternatively include only one type of test cells: either test cells with a star configuration, or test cells with a ladder/magazine configuration. Additionally, test cells having other configurations may be used without departing from the scope and spirit of the present invention. Moreover, although only one buffer zone, one re-work station, one test cell of a star configuration, and one test cell of a ladder/magazine configuration are shown in FIG. 2, those of ordinary skill in the art will appreciate that more than one buffer zone, more than one re-work station, more than one test cell of a star configuration, and/or more than one test cell of a ladder/magazine configuration may be included in the system 200 in accordance with the present invention.

FIG. 3 shows an exemplary embodiment of the storage component interface module 214 shown in FIG. 2 in accordance with the present invention, and FIG. 4, FIGS. 4A, 4B, and 4C are a plan view, a top plan view, a front elevation view, and a side elevation view of the storage component interface module 214, respectively. The storage component interface module 214 has a fist surface 320 (e.g., a front surface) that may include a plurality of ports including power source on/off switches 302, serial ports 304, Ethernet connectors 306, power source connectors 308, Fibre Channel ports 310, and the like. These ports may be connectors with a polarity (male or female). Thus, all externally required wiring for the test, e.g., Fibre Channel cables, power cables, Ethernet cables, and the like may be provided via the single storage component interface module 214. The storage component interface module 214 may have a second surface 322 (e.g., a back surface) that may include holes 314 that permit wiring harness 312 to pass though and to be connected to the SAN target 216, e.g., a PC, a host, or the like, for testing. Thus, since the data storage array component may have corresponding connectors with a polarity (e.g., female) that is opposite to the polarity (e.g., male) of the ports of the storage component interface module 214, the storage component interface module 214 may allow the date storage array component to be connected to all externally required wiring in a single operation (e.g., docking). Additionally, the storage component interface module 214 may not require modification of the existing storage array component or controller, i.e., no customized port is required.

The storage component interface module according to the present invention may be made to interface with multiple controller types via mechanical slides (see FIG. 5 below for detail). Alternatively, different storage controllers or drive trays may have their own unique interface module if each interface module has a fixed mechanical design.

The storage component interface module according to the present invention may have the following advantages. First, by collecting all of the required external wiring into a fixed single interface module, wiring mistakes may be eliminated, and variability may be reduced, thus resulting in increased testing quality and reduced production time. Moreover, automation of the connection and disconnection of the data storage array components may reduce the testing time. Additionally, various controllers or drive trays may be swapped in and out of the interface module for rapid testing in an environment very similar to a customer environment. Furthermore, via a single, rapid connection interface module, different controllers may be robotically swapped in and out to automate the testing of these controllers as they are produced on the assembly line. This may reduce production manpower and thus reduce production cost. Moreover, using a single interface module for the controllers may allow variation between the controllers to be detected, increasing product quality.

Referring now to FIG. 5, an exemplary embodiment of the storage component interface 222 having a ladder/magazine configuration shown in FIG. 2 in accordance with the present invention is shown. The storage component interface 222 may include guides 502 and the test interface modules 214 shown in FIGS. 3, 4, 4A, 4B, and 4C, which may move along a movable vertical axis 504 in a first direction 508 (e.g., upward) or a second direction 510 (e.g., downward).

The present invention may have the following advantages. First, the present invention may optimize production throughput via automatic storage array component dispatch prioritization. Additionally, the present invention may reduce manpower costs and save production time via automatic testing of components. Moreover, the present invention may increase product quality and reduce variables through automated handling of storage array components. Furthermore, the present invention may reduce human errors by using a centralized database to house storage array component dispatch and testing information. In addition, the present invention may allow simple expansion to new storage components by adding a new storage array component interface module with appropriate control software upgrades. This may eliminate large workforce training programs and costs required with new components. Moreover, according to the present invention, if a product fails test, the product may be automatically routed to a reject branch for re-work. This product may be tagged with a RFID tag or a bar code as a reject and will not be allowed into standard workflow until re-work is complete and a retest is appropriate.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for automating data storage array components testing, comprising:
    obtaining a serial number of a data storage array component;
    processing said serial number through a shop order dispatch system to determine if said serial number is of high priority in comparison with other data storage array components in a queue and if there is any test cell available for testing said data storage array component;
    retrieving a product type and test requirements from a database based on said serial number when said serial number is of high priority and when there is a test cell available for testing said data storage array component;
    routing said data storage array component to said test cell from an assembly line when a test is required for said data storage array component;
    positioning said data storage array component and a storage component interface module of a storage component interface of said test cell so that said data storage array component and said storage component interface module face each other, wherein said storage component interface module is chosen based on said test requirements;
    docking said data storage array component into said storage component interface so that said data storage array component is connected to said storage component interface module; and
    running said test.

2. The method of claim 1, wherein said obtaining step further comprising reading a RFID tag on said data storage array component by a RFID scanner to obtain said serial number.

3. The method of claim 1, wherein said obtaining step further comprising reading a bar code on said data storage array component by a bar code scanner to obtain said serial number.

4. The method of claim 1, further comprising routing said data storage array component to a buffer area when said serial number is of low priority.

5. The method of claim 4, further comprising keeping said data storage array component in said buffer area when there is no test cell available for testing said data storage array component.

6. The method of claim 4, further comprising releasing said data storage array component into work flow when there is a test cell available for testing said data storage array component.

7. The method of claim 1, further comprising routing said data storage array component to a buffer area when there is no test cell available.

8. The method of claim 1, further comprising sending results of said test to said database after said test is finished.

9. The method of claim 1, further comprising notifying said shop order dispatch system of a status of said test cell after said test is finished.

10. The method of claim 1, further comprising undocking and routing said data storage array component back to said assembly line after said test is finished.

11. The method of claim 10, further comprising placing said data storage array component into work flow when said data storage array component passes said test.

12. The method of claim 10, further comprising placing said data storage array component into a re-work station when said data storage array component does not pass said test.

13. A system for automating data storage array components testing, comprising:
    means for obtaining a serial number of a data storage array component;
    means for processing said serial number through a shop order dispatch system to determine if said serial number is of high priority in comparison with other data storage array components in a queue and if there is any test cell available for testing said data storage array component;
    means for retrieving a product type and test requirements from a database based on said serial number when said serial number is of high priority and when there is a test cell available for testing said data storage array component;
    means for routing said data storage array component to said test cell from an assembly line when a test is required for said data storage array component;
    means for positioning said data storage array component and a storage component interface module of a storage component interface of said test cell so that said data storage array component and said storage component interface module face each other, wherein said storage component interface module is chosen based on said test requirements;
    means for docking said data storage array component into said storage component interface so that said data storage array component is connected to said storage component interface module; and
    means for running said test.

14. The system of claim 13, wherein said means for obtaining further comprising means for reading a RFID tag on said data storage array component by a RFID scanner to obtain said serial number.

15. The system of claim 13, wherein said means for obtaining further comprising means for reading a bar code on said data storage array component by a bar code scanner to obtain said serial number.

16. The system of claim 13, further comprising means for routing said data storage array component to a buffer area when said serial number is of low priority.

17. The system of claim 16, further comprising means for keeping said data storage array component in said buffer area when there is no test cell available for testing said data storage array component.

18. The system of claim 16, further comprising means for releasing said data storage array component into work flow when there is a test cell available for testing said data storage array component.

19. The system of claim 13, further comprising means for routing said data storage array component to a buffer area when there is no test cell available.

20. The system of claim 13, further comprising means for sending results of said test to said database after said test is finished.

21. The system of claim 13, further comprising means for notifying said shop order dispatch system of a status of said test cell after said test is finished.

22. The system of claim 13, further comprising means for undocking and routing said data storage array component back to said assembly line after said test is finished.

23. The system of claim 22, further comprising means for placing said data storage array component into work flow when said data storage array component passes said test.

24. The system of claim 22, further comprising means for placing said data storage array component into a re-work station when said data storage array component does not pass said test.

25. A computer-readable medium having computer-executable instructions for performing a method comprising:
obtaining a serial number of a data storage array component;
processing said serial number through a shop order dispatch system to determine if said serial number is of high priority in comparison with other data storage array components in a queue and if there is any test cell available for testing said data storage array component;
retrieving a product type and test requirements from a database based on said serial number when said serial number is of high priority and when there is a test cell available for testing said data storage array component;
routing said data storage array component to said test cell from an assembly line when a test is required for said data storage array component;
positioning said data storage array component and a storage component interface module of a storage component interface of said test cell so that said data storage array component and said storage component interface module face each other, wherein said storage component interface module is chosen based on said test requirements;
docking said data storage array component into said storage component interface so that said data storage array component is connected to said storage component interface module; and
running said test.

26. The computer-readable medium of claim 25, wherein said obtaining step of said method further comprising reading a RFID tag on said data storage array component by a RFID scanner to obtain said serial number.

27. The computer-readable medium of claim 25, wherein said obtaining step of said method further comprising reading a bar code on said data storage array component by a bar code scanner to obtain said serial number.

28. The computer-readable medium of claim 25, wherein said method further comprising routing said data storage array component to a buffer area when said serial number is not of high priority.

29. The computer-readable medium of claim 28, wherein said method further comprising keeping said data storage array component in said buffer area when there is no test cell available for testing said data storage array component.

30. The computer-readable medium of claim 28, wherein said method further comprising releasing said data storage array component into work flow when there is a test cell available for testing said data storage array component.

31. The computer-readable medium of claim 25, wherein said method further comprising routing said data storage array component to a buffer area when there is no test cell available.

32. The computer-readable medium of claim 25, wherein said method further comprising sending results of said test to said database after said test is finished.

33. The computer-readable medium of claim 25, wherein said method further comprising notifying said shop order dispatch system of a status of said test cell after said test is finished.

34. The computer-readable medium of claim 25, wherein said method further comprising undocking and routing said data storage array component back to said assembly line after said test is finished.

35. The computer-readable medium of claim 34, wherein said method further comprising placing said data storage array component into work flow when said data storage array component passes s aid test.

36. The computer-readable medium of claim 34, wherein said method further comprising placing said data storage array component into a re-work station when said data storage array component does not pass said test.

37. A system for automating data storage array components testing, comprising:
an assembly line;
means for obtaining a serial number of a data storage array component on said assembly line; and
a test cell for testing said data storage array component based on said serial number, said test cell connected to said assembly line.

38. The system of claim 37, wherein said means for obtaining comprising a RFID scanner for reading a RFID tag on said data storage array component to obtain said serial number.

39. The system of claim 37, wherein said means for obtaining comprising a bar code scanner for reading a bar code on said data storage array component to obtain said serial number.

40. The system of claim 37, further comprising a re-work area to which said storage array component is routed from said assembly line after said storage array component fails said test.

41. The system of claim 37, further comprising a database for storing said serial number, a product type and test requirements of said storage array component.

42. A system for automating data storage array components testing, comprising:
- an assembly line;
- means for obtaining a serial number of a data storage array component on said assembly line;
- a test cell for testing said data storage array component based on said serial number, said test cell connected to said assembly line; and
- a shop order dispatch system for determining whether said serial number is of high priority in comparison with other data storage array components in a queue and whether there is any test cells available for testing said data storage array component.

43. The system of claim 42, further comprising a buffer zone to which said data storage array component is routed from said assembly line when said serial number is of low priority.

44. The system of claim 42, further comprising a buffer zone to which said data storage array component is routed from said assembly line when there is no test cells available for testing said data storage array component.

45. A system for automating data storage array components testing, comprising:
- an assembly line;
- means for obtaining a serial number of a data storage array component on said assembly line; and
- a test cell for testing said data storage array component based on said serial number, said test cell connected to said assembly line, said test cell comprising:
  - a storage component interface comprising a plurality of storage component interface modules;
  - a plurality of storage array network targets communicatively coupled to said storage component interface; and
  - a rotating carousel for positioning said storage array component into said storage component interface so that said storage array component is connected to one of said a plurality of storage component interface modules for testing.

46. The system of claim 45, wherein said storage component interface is in a circular shape.

47. The system of claim 45, wherein said one of said a plurality of storage component interface modules comprising:
- a first surface including at least one of power source on/off switches, serial ports, Ethernet connectors, power source connectors, and Fibre Channel ports; and
- a second surface through which wiring harness for said at least one of power source on/off switches, serial ports, Ethernet connectors, power source connectors, and Fibre Channel ports is connected to one of said a plurality of storage array network targets.

48. A system for automating data storage array components testing, comprising:
- an assembly line;
- means for obtaining a serial number of a data storage array component on said assembly line; and
- a test cell for testing said data storage array component based on said serial number, said test cell connected to said assembly line, said test cell comprising:
  - a storage component interface comprising a plurality of storage component interface modules;
  - a plurality of storage array network targets communicatively coupled to said storage component interface; and
  - a sliding means for placing one of said a plurality of storage component interface modules said storage into a position so that said storage array component is connected to said one of said a plurality of storage component interface modules for testing.

49. The system of claim 48, wherein said storage component interface is movable vertically.

50. The system of claim 48, wherein said storage component interface module comprising:
- a first surface including at least one of power source on/off switches, serial ports, Ethernet connectors, power source connectors, and Fibre Channel ports; and
- a second surface through which wiring harness for said at least one of power source on/off switches, serial ports, Ethernet connectors, power source connectors, and Fibre Channel ports is connected to one of said a plurality of storage array network targets.

51. A storage component interface module, comprising:
- a first surface including a plurality of ports for connecting to a data storage array component for testing said data storage array component;
- wherein wiring for testing said data storage array component is provided via said first surface.

52. The storage component interface module of claim 51, wherein said a plurality of ports are male connectors.

53. The storage component interface module of claim 51, wherein said a plurality of ports are female connectors.

54. The storage component interface module of claim 51, wherein said a plurality of ports include at least one of power source on/off switches, serial ports, Ethernet connectors, power source connectors, and Fibre Channel ports.

55. The storage component interface module of claim 51, further comprising:
- a second surface through which wiring harness for said a plurality of ports is connected to a storage array network target.

56. The storage component interface module of claim 55, wherein said a plurality of ports include at least one of power source on/off switches, serial ports, Ethernet connectors, power source connectors, and Fibre Channel ports.

57. The storage component interface module of claim 55, wherein said second surface is opposite said first surface.

* * * * *